(12) United States Patent
Lu (10) Patent No.: US 7,942,269 B2
(45) Date of Patent: May 17, 2011

(54) CARRIER OF RETICLE POD AND THE FIXING ELEMENT THEREOF

(75) Inventor: Pao-Yi Lu, Shulin (TW)

(73) Assignee: Gudeng Precision Industrial Co., Ltd, Shulin (TW)

( * ) Notice: Subject to any disclaimer, the term of this patent is extended or adjusted under 35 U.S.C. 154(b) by 49 days.

(21) Appl. No.: 12/247,316

(22) Filed: Oct. 8, 2008

(65) Prior Publication Data
US 2010/0032331 A1  Feb. 11, 2010

(30) Foreign Application Priority Data
Aug. 7, 2008 (TW) ............................... 97129989 A (51) Int. Cl.
  *B65D 85/30* (2006.01)
  *B65D 81/02* (2006.01)
(52) U.S. Cl. ......... 206/586; 206/454; 206/710; 206/453
(58) Field of Classification Search ............ 206/454, 206/521.6, 521.7, 591, 453, 586, 592, 449, 206/477, 387.1, 387.15, 710–712
See application file for complete search history.

(56) References Cited

U.S. PATENT DOCUMENTS

| | | | | |
|---|---|---|---|---|
| 3,635,332 A | * | 1/1972 | Ross | 206/591 |
| 3,756,383 A | * | 9/1973 | Kryter | 206/387.14 |
| 4,003,468 A | * | 1/1977 | Berkman | 206/307.1 |
| 4,043,451 A | * | 8/1977 | Johnson | 206/711 |
| 4,436,215 A | * | 3/1984 | Kleinert et al. | 220/533 |
| 4,629,066 A | * | 12/1986 | Howard | 206/387.15 |
| 4,721,207 A | * | 1/1988 | Kikuchi | 206/307 |
| 4,946,037 A | * | 8/1990 | Keith | 206/431 |
| 5,025,924 A | | 6/1991 | Watanabe | |
| 5,399,398 A | | 3/1995 | Toshimitsu et al. | |
| 5,749,467 A | | 5/1998 | Gregerson | |
| 6,041,937 A | | 3/2000 | Wu et al. | |
| 2005/0057011 A1 | | 3/2005 | Chang | |
| 2006/0032785 A1 | | 2/2006 | Liu | |

\* cited by examiner

*Primary Examiner* — Chun Cheung

(74) *Attorney, Agent, or Firm* — Ming Chow; Sinorica, LLC (57) ABSTRACT

This invention is related to a carrier of reticle pod. The carrier of reticle pod comprises an upper cover and a lower cover, and the upper cover is configured to be coupled to the lower cover to form an interior space for accommodation. The lower cover includes several pairs of guide tracks disposed on two opposite lateral sides of inner surface of the lower cover. Clapboards are set into the lower cover via the guide tracks to separate the space for accommodation into a plurality of spaces for accommodation for storing reticle pod. Fixing elements including a clipping portion and a resisting portion are disposed on the top surface of the inner surface of upper cover. When the upper cover closes the lower cover, each fixing element of the upper cover is configured to be coupled to each reticle pod stored in the carrier.

18 Claims, 7 Drawing Sheets

Fig. 7

CARRIER OF RETICLE POD AND THE FIXING ELEMENT THEREOF

BACKGROUND OF THE INVENTION

1. Field of the Invention

The present field of the invention is related to a carrier of reticle pod, and more particularly, to a carrier of reticle pod disposed with a plurality of fixing elements for fixing reticle pods in the carrier.

2. Description of the Prior Art

Semiconductor technology has undergone rapid development in recent years, wherein optical lithography plays an important role as everything related to pattern definition needs to rely on optical lithography. In the application of optical lithography in semiconductor, designed circuits are made into light-transmissible photo mask with specific form. By applying the principle of exposure, when light source is transmitted through the photo mask and projected onto silicon wafer, specific pattern can be shown after exposure. Since any dust particles (i.e. particles, dust, or organic matters) attaching on the photo mask will lead to aggravation of quality of projection and imaging, photo mask used for producing pattern needs to be maintained in absolute cleanliness. Therefore in ordinary wafer producing process, clean room environment is provided to prevent from contamination of particles in the air. However, state of absolute cleanliness cannot be achieved in clean room at present. Currently, contamination-resistant reticle pod is used in semiconductor process for performing storage and transportation of reticle pod to maintain cleanliness of photo mask.

And the most frequently used method for transferring photo mask is to store a single photo mask in a single reticle pod and then place several reticle pods together in a carrier of reticle pod, and to fill the carrier of reticle pod with soft materials (for example, foam and sponge) to reduce gap in the carrier of reticle pod and to reinforce and fix each photo mask at the same time, preventing photo mask stored in reticle pod from being affected by rubbing or damaging of photo mask due to vibration of the carrier of reticle pod generated during the process of transferring the photo mask. However, as far as supplier of photo mask is concerned, in addition to that reticle pod needs to be fixedly placed in the carrier of reticle pod during the process of delivery, soft materials need to be manually filled in the carrier of reticle pod to ensure that there are not too many gaps in the carrier; as far as consumer of photo mask is concerned, before reticle pod is taken out, soft materials filled in the carrier of reticle pod also need to be manually removed first to take out reticle pod thereafter and the soft materials used for filling need to be disposed afterwards. Therefore, not only that both the supplier and the consumer need to spend time and manpower in packing and removal of these soft materials, but that if these used soft materials are directly disposed without being recycled for repetitive use, then these non-decomposable soft materials lead to environmental pollution.

SUMMARY OF THE INVENTION

In order to solve the aforementioned problems, an objective of the present invention is to provide a carrier of reticle pod disposed with a plurality of fixing elements for fixing reticle pod in the carrier and achieving better effects of vibration-proof and protection for protecting reticle pod in the carrier.

Another objective of the present invention is to provide a carrier of reticle pod disposed with fixing elements with better function of prevention from rubbing or damaging of photo mask and reduction of particles generated.

Still another objective of the present invention is to provide a fixing element with better flexible structure to effectively release stress.

Yet another objective of the present invention is to provide a fixing element with simpler method for disposition and easy to be removed or replaced one at a time.

Still another objective of the present invention is to provide a carrier of reticle pod further including a seal ring to achieve better effect of air tightness.

Yet another objective of the present invention is to provide a carrier of reticle pod further including a non-slip pad to prevent reticle pod from slipping and thus causing vibration of photo mask.

According to objectives described above, the present invention provides a fixing element disposed in carrier of reticle pod. The carrier of reticle pod includes an upper cover, a lower cover, a plurality of clapboards, and a plurality of fixing elements. The upper cover and the lower cover are configured to be coupled to each other to form an interior space for accommodation. The lower cover includes several pairs of guide tracks disposed on two opposite lateral sides of inner surface of the lower cover. Clapboards are set into the lower cover via the guide tracks to separate the space for accommodation into a plurality of spaces for accommodation for storing several reticle pods. The fixing elements are disposed on the top surface of the inner surface of upper cover. Each of the fixing elements includes a top portion with each of two sides respectively disposed with a pair of wing portions slantwise extending outward. The pair of wing portions bend downward at a proper bent portion for the free ends of the pair of wing portions to form clipping portion, and the pair of wing portions further slantwise extend toward inner side of free ends of the pair of wing portions at the bent portion to form a resisting portion, wherein a first distance is maintained between the resisting portion and the top portion.

Therefore, when the upper cover of the carrier closes the lower cover, each fixing element of the upper cover can be coupled to each reticle pod stored in the carrier, and the clipping portion of fixing element can clip the reticle pod, and the resisting portion of fixing element can sustain the reticle pod to prevent the photo mask stored in the reticle pod from being affected by rubbing or damaging due to vibration of carrier generated during the process of transferring reticle pod, which leads to better effects of vibration-proof and protection and reduction of dust particles generated.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention discloses a carrier of reticle pod, and more particularly, to a carrier of reticle pod disposed with a plurality of fixing elements for fixing reticle pod in the carrier. Since some details of fabrication or processing of photo mask or reticle pod are achieved by applying conventional art in the present invention, thus these details are not completely depicted in the description below. And the drawings referred to in the following description are not made according to actual related sizes, the function of which is only for illustrating characteristics of the present invention.

Figure 1:
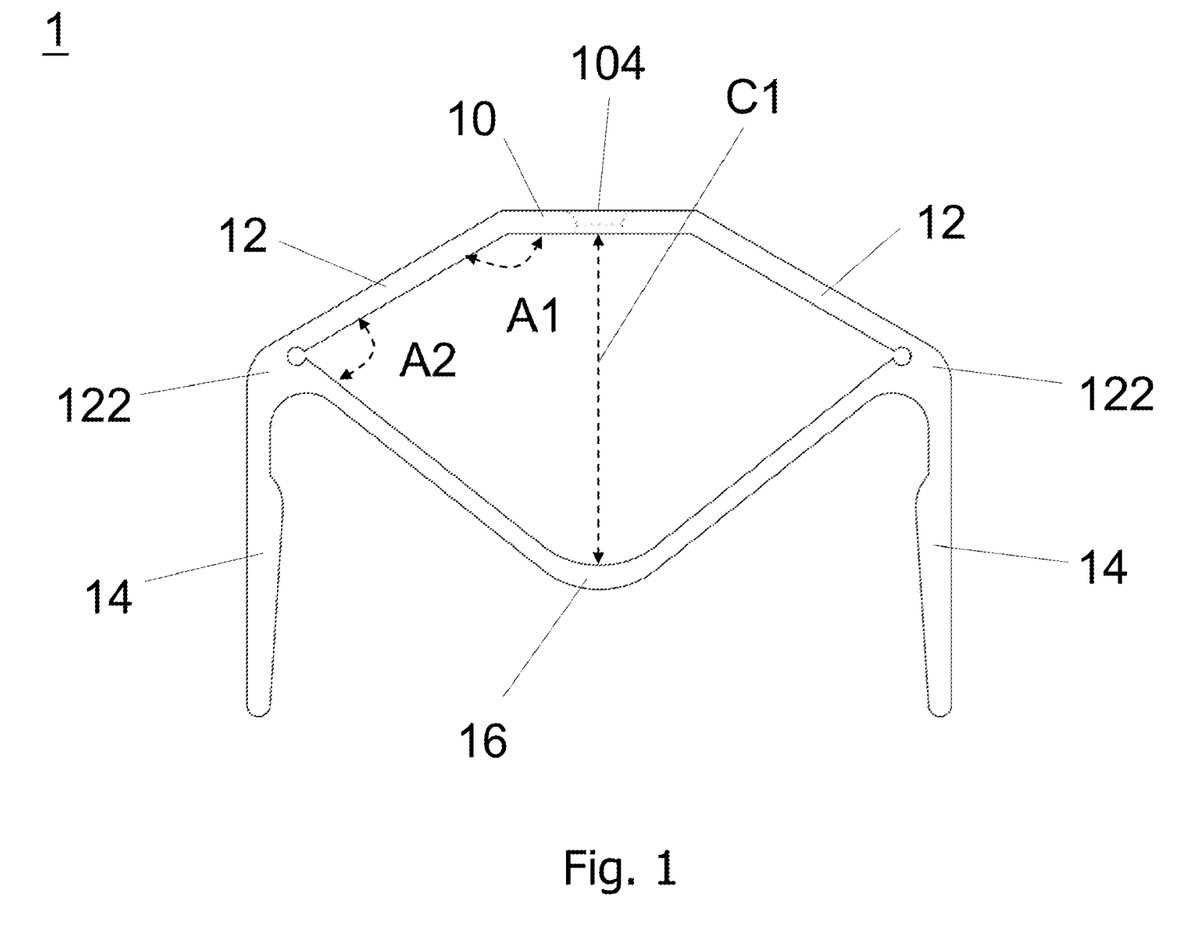
FIG. 1 is a view of a preferred embodiment of fixing element of the present invention.

FIG. 1 is a view of a preferred embodiment of fixing element according to the present invention. The fixing element 1 includes a top portion 10 with a fastening hole 104 disposed on the top surface of top portion 10 for a fastening element (not shown in Figure) to fasten the fixing element 1. On each of two sides of top portion 10 is respectively disposed with a pair of wing portions 12 slantwise extending outward. The pair of wing portions 12 bend downward at a proper bent portion 122 for the free ends of the pair of wing portions 12 to form a clipping portion 14 respectively, and the pair of wing portions 12 further branch and slantwise extend toward inner side of free ends of the pair of wing portions 12 at the bent portion 122 of wing portions 12 to form a resisting portion 16, wherein a first distance C1 is maintained between the resisting portion 16 and the top portion 10 to form a buffer space when the top portion 10 is exerted with pressure.

Following what is described above, the shape of resisting portion 16 is similar to a V-shaped structure, and in the whole structure, the thickness of two ends is thinner than that of the central part. And a first included angle A1 formed by the top portion 10 and the wing portions 12 extending slantwise is an obtuse angle, the angle being about 100~170 degrees and being preferred to be designed as about 120~160 degrees. Moreover, a second included angle A2 between the wing portions 12 and the resisting portion 16 formed by wing portions 12 extending slantwise at bent portion 122 is an acute angle, the angle being about 10~75 degrees and being preferred to be designed as about 20~60 degrees. Furthermore, a first curved groove 124 is formed between each bent portion 122 and free end, and therefore the fixing element 1 has a better flexible structure to effectively release stress. Obviously, the top portion 10, wing portions 12, bent portion 122, clipping portion 14, and resisting portion 16 of fixing element 1 are an integrated structure made of flexible material, and the material for fabrication can be selected from the group consisting of: polymer material, plastic material, and polyethylene (PE) material or polypropylene (PP) material, wherein PE material is a wear-resisting material.

Figure 2:
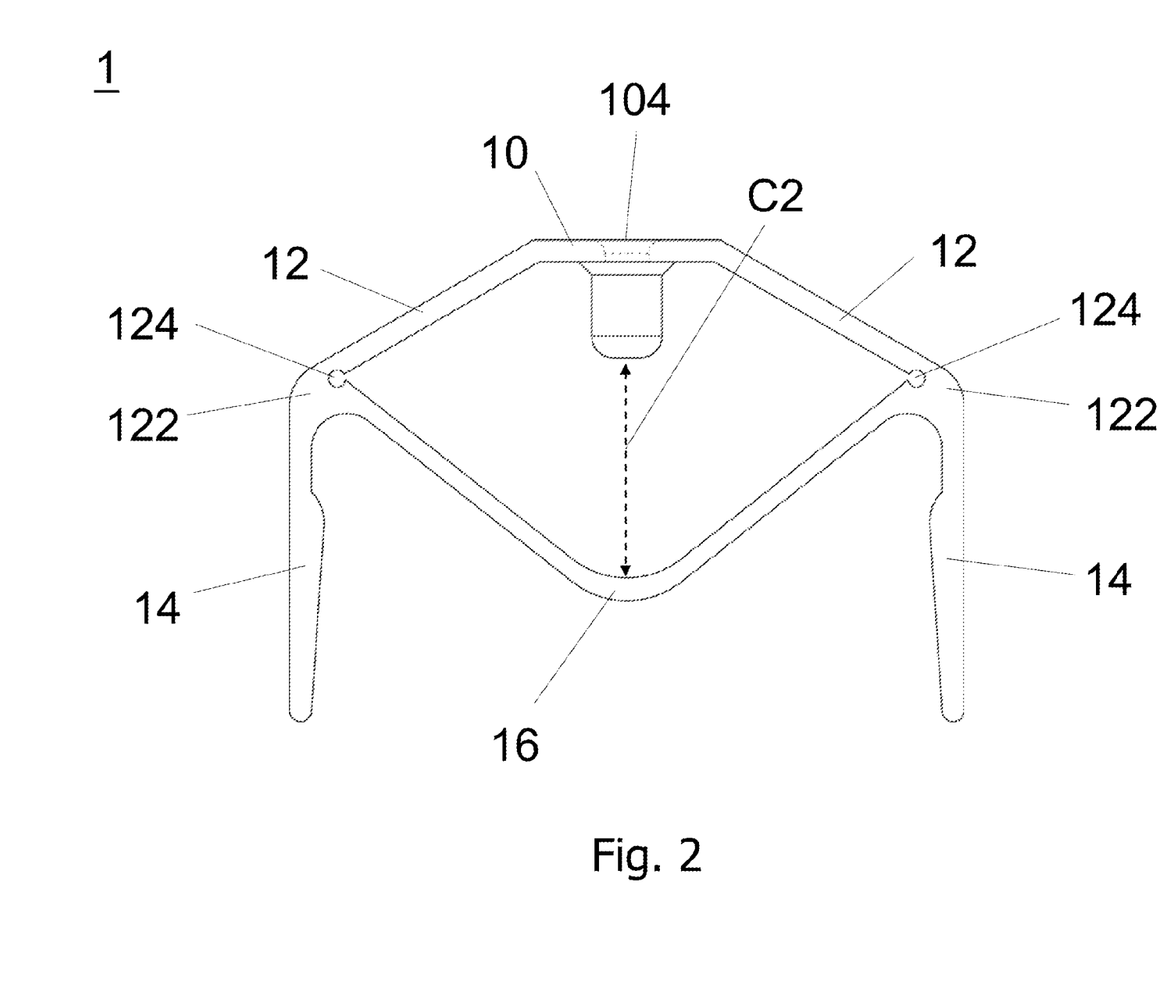
FIG. 2 is a view of another preferred embodiment of fixing element of the present invention.

FIG. 2 is a view of another preferred embodiment of fixing element according to the present invention. The fixing element 1 includes a top portion 10 with a fastening hole 104 disposed on the top surface of top portion 10 for a fastening element (not shown in Figure) to fasten the fixing element 1. A cylindrical top body 102 is further disposed on the top portion 10, and the cylindrical top body 102 is a hollow top body. On each of two sides of top portion 10 is respectively disposed with a pair of wing portions 12 slantwise extending outward. The pair of wing portions 12 bend downward at a proper bent portion 122 for the free ends of the pair of wing portions 12 to form a clipping portion 14 respectively, and the pair of wing portions 12 further branch and slantwise extend toward inner side of free ends of the pair of wing portions 12 at the bent portion 122 of wing portions 12 to form a resisting portion 16, wherein a second distance C2 is maintained between the resisting portion 16 and the cylindrical top body 102 to form a buffer space when the top portion 10 is exerted with pressure. And the length of the cylindrical top body 102 can be ¼~¾ of distance between top portion 10 and the lowest part of resisting portion 16, or can be half of the distance between top portion 10 and the lowest part of resisting portion 16.

Following what is described above, the shape of resisting portion 16 is similar to a V-shaped structure, and in the whole structure, the thickness of two ends is thinner than that of the central part. And a first included angle A1 formed by the top portion 10 and the wing portions 12 extending slantwise is an obtuse angle, the angle being about 100~170 degrees and being preferred to be designed as about 120~160 degrees. Moreover, a second included angle A2 between the wing portions 12 and the resisting portion 16 formed by wing portions 12 extending slantwise at bent portion 122 is an acute angle, the angle being about 10~75 degrees and being preferred to be designed as about 20~60 degrees. Furthermore, a first curved groove 124 is formed between each bent portion 122 and free end, and therefore the fixing element 1 has a better flexible structure to effectively release stress. The top portion 10, wing portions 12, bent portion 122, clipping portion 14, and resisting portion 16 are an integrated structure made of flexible material, and the material for fabrication can be selected from the group consisting of: polymer material, plastic material, and PE material or PP material, wherein PE material is a wear-resisting material. Obviously, the fixing element 1 as described above has a simpler structure and can be integrated by using conventional injection molding, and therefore the production cost is very low.

Figure 3:
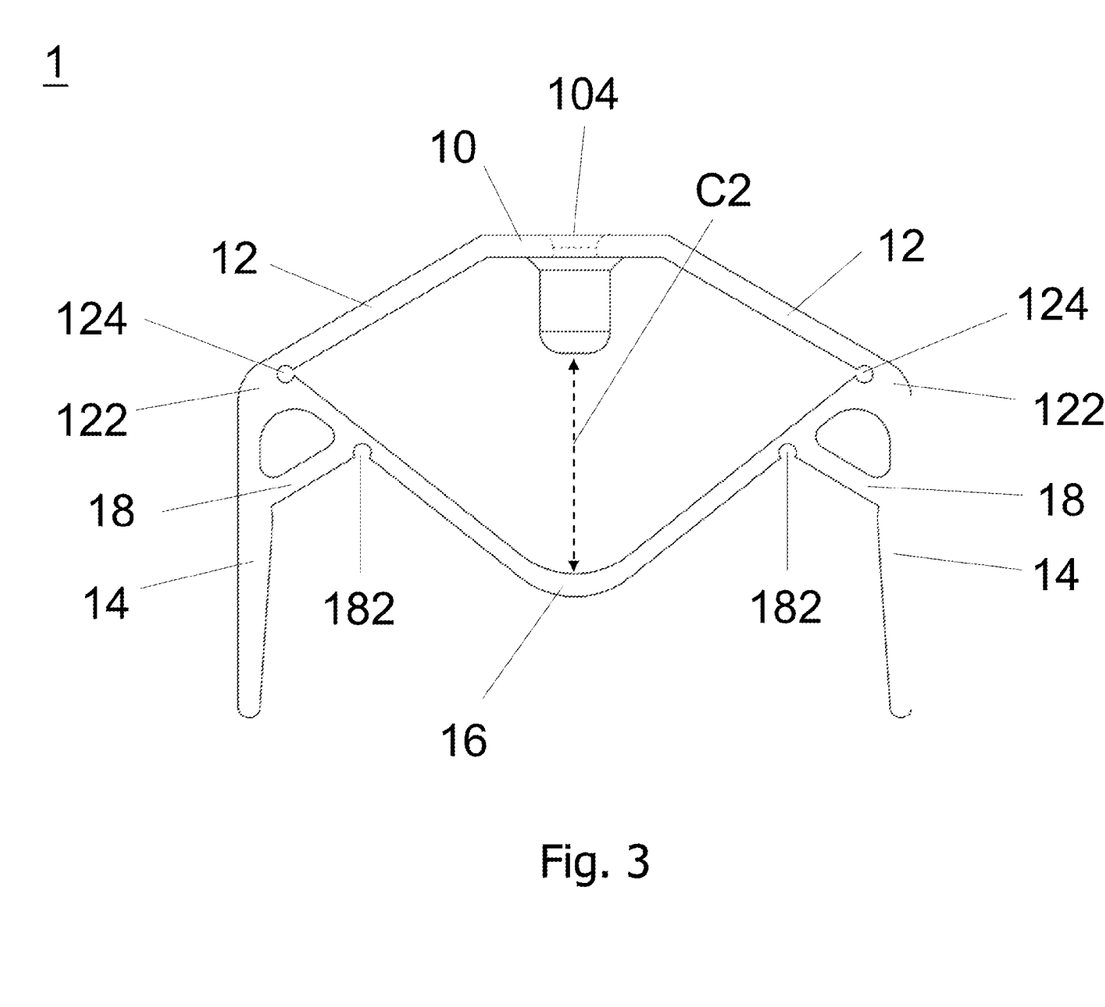
FIG. 3 is a view of still another preferred embodiment of fixing element of the present invention.

FIG. 3 is a view of still another preferred embodiment of fixing element according to the present invention. This fixing element 1 includes a top portion 10 with a fastening hole 104 disposed on the top surface of top portion 10 for a fastening element (not shown in Figure) to fasten the fixing element 1. A cylindrical top body 102 is further disposed on the top portion 10, and the cylindrical top body 102 is a hollow top body. On each of two sides of top portion 10 is respectively disposed with a pair of wing portions 12 slantwise extending outward. The pair of wing portions 12 bend downward at a proper bent portion 122 for the free ends of the pair of wing portions 12 to form a clipping portion 14 respectively, and the pair of wing portions 12 further branch and slantwise extend toward inner side of free ends of the pair of wing portions 12 at the bent portion 122 of wing portions 12 to form a resisting portion 16, at least a support portion 18 being further disposed between the clipping portion 14 and the resisting portion 16. Wherein, the thickness of the part of support portion 18 connected to the resisting portion 16 is thinner than that of other part of support portion 18, and the part of support portion 18 connected to the resisting portion 16 includes a second curved groove 182. A second distance C2 is maintained between the resisting portion 16 and the cylindrical top body 102 to form a buffer space when the top portion 10 is exerted with pressure. And the length of the cylindrical top body 102 can be ¼~¾ of distance between top portion 10 and the lowest part of resisting portion 16, or can be half of the distance between top portion 10 and the lowest part of resisting portion 16; thus the fixing element 1 has a more solid and better flexible structure.

Following what is described above, the shape of resisting portion 16 is similar to a V-shaped structure, and in the whole structure, the thickness of two ends is thinner than that of the central part. And a first included angle A1 formed by the top portion 10 and the wing portions 12 extending slantwise is an obtuse angle, the angle being about 100~170 degrees and being preferred to be designed as about 120~160 degrees. Moreover, a second included angle A2 between the wing portions 12 and the resisting portion 16 formed by wing portions 12 extending slantwise at bent portion 122 is an acute angle, the angle being about 10~75 degrees and being preferred to be designed as about 20~60 degrees. Furthermore, a first curved groove 124 is formed between each bent portion 122 and free end, and therefore the fixing element 1 has a better flexible structure to effectively release stress. The top portion 10, wing portions 12, bent portion 122, clipping portion 14, resisting portion 16, and support portion 18 are an integrated structure made of flexible material, and the material for fabrication can be selected from the group consisting of: polymer material, plastic material, and PE material or PP material, wherein PE material is a wear-resisting material.

Figure 4:
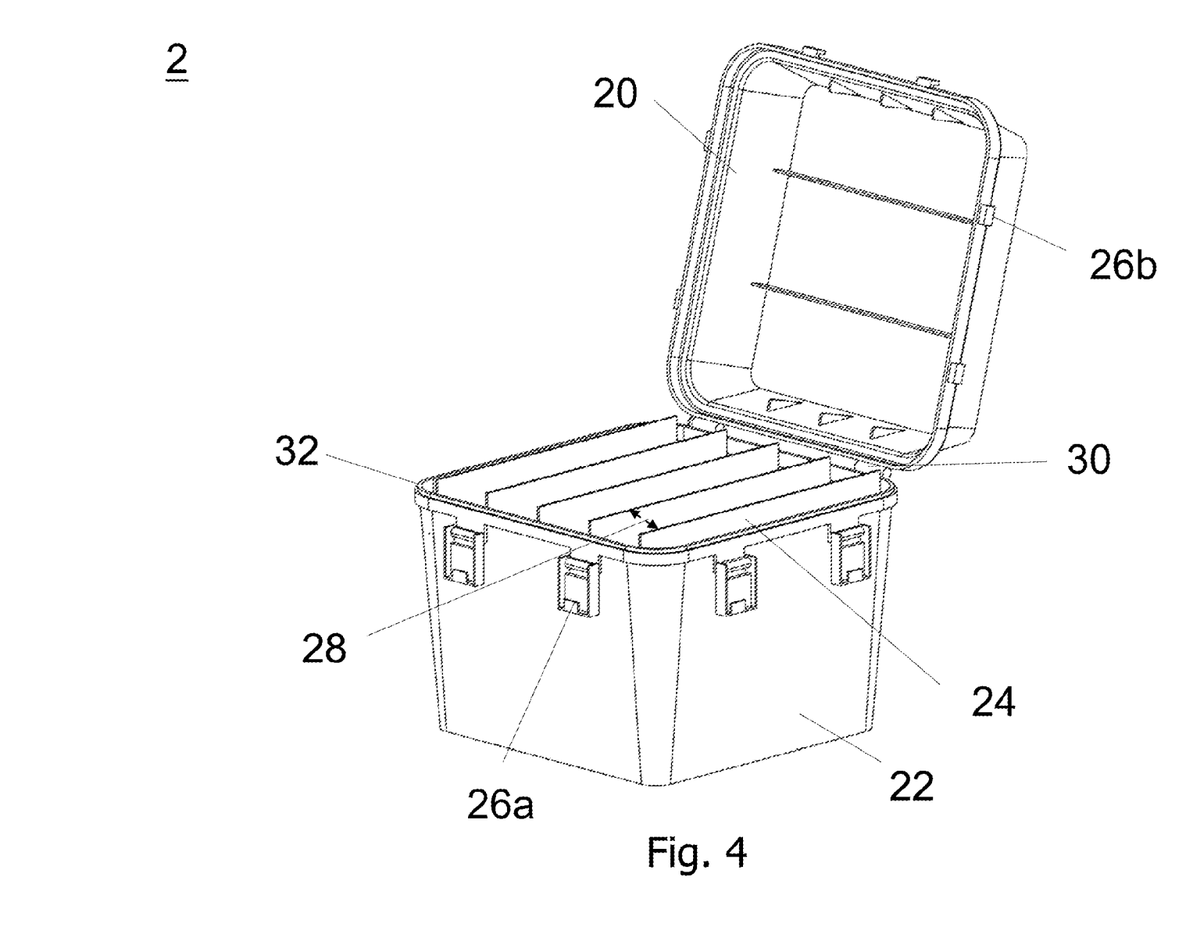
FIG. 4 is a side view of carrier of reticle pod of the present invention.
Figure 5:
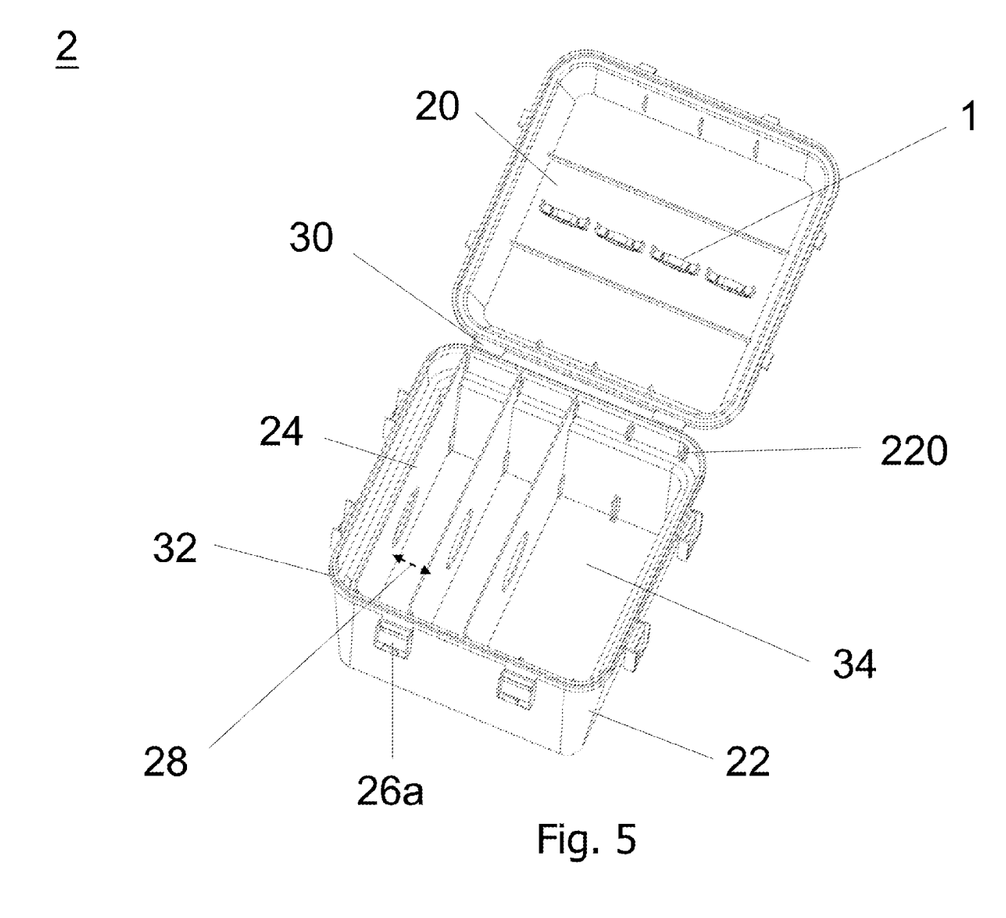
FIG. 5 is a top view of carrier of reticle pod of the present invention.

FIG. 4 and FIG. 5 are views of a preferred embodiment of carrier according to the present invention. The carrier 2 comprises an upper cover 20 with space for accommodation and a lower cover 22 with space for accommodation, and therefore the upper cover 20 and the lower cover 22 can be configured to be coupled to each other to form an interior space for accommodating objects (reticle pod for example). At least a clapboard 24 is disposed in the space for accommodation of the lower cover 22; and at least a pair of guide tracks 220 are disposed on two opposite lateral sides of inner surface of the space for accommodation of lower cover 22 for the clapboard 24 to be set in to separate the space for accommodation of carrier 2 into a plurality of spaces 28 for accommodating reticle pod.

Moreover, the carrier 2 further includes several snap elements 26a disposed on the outer lateral side of lower cover 22 and several snap side portions 26b disposed on the outer lateral side of upper cover 20, the snap elements 26a and the snap side portions 26b being disposed on different covers that are coupled to each other. Moreover, the upper cover 20 is joined to one side of lower cover 22 via hinge 30, a seal ring 32 is disposed at the opening of cover body of lower body 22 to provide the carrier 2 with better effect of air tightness, and a non-slip pad 34 is further disposed on the bottom surface of the lower cover to prevent reticle pod in carrier 2 from sliding and thus causing vibration of photo mask.

Figure 6:
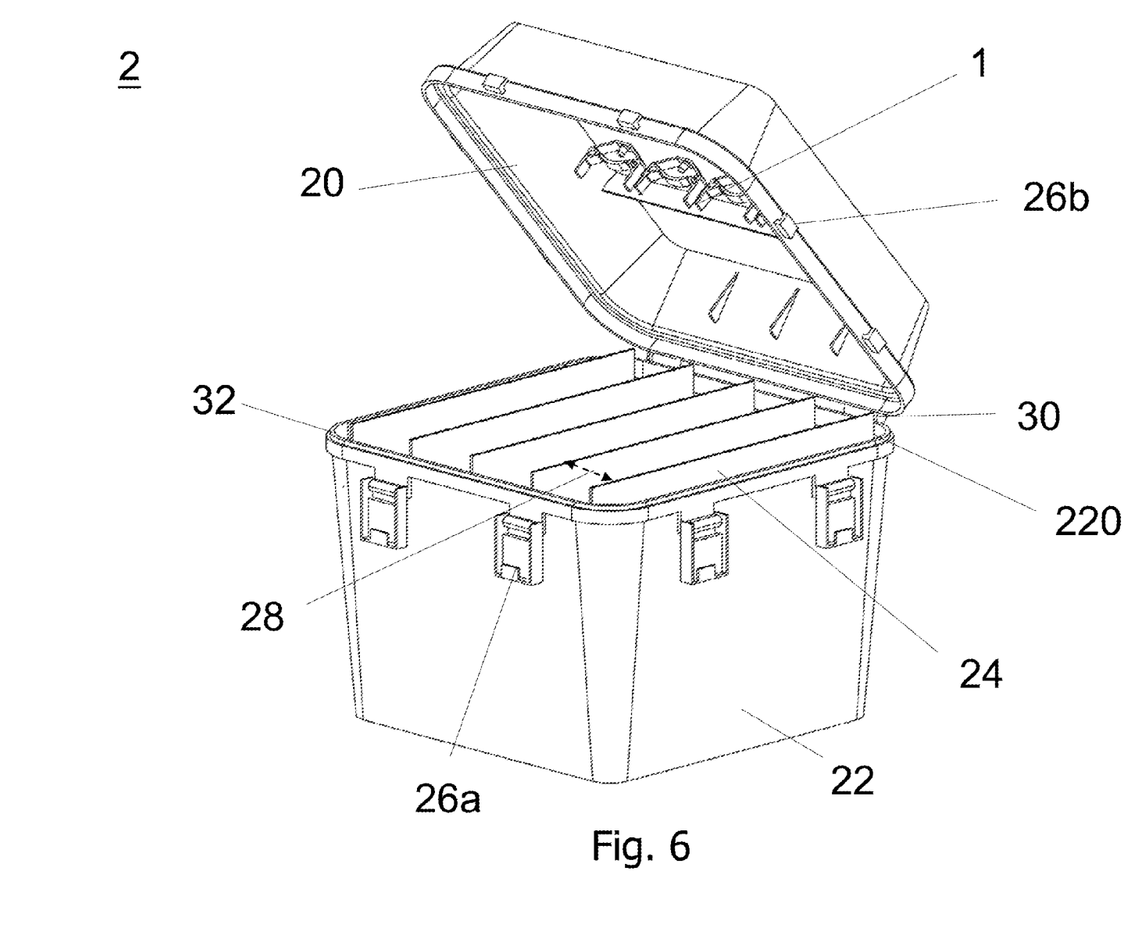
FIG. 6 is a side view of carrier of the present invention.

FIG. 6 is a view of a preferred embodiment of carrier according to the present invention. The carrier 2 comprises an upper cover 20 with space for accommodation and a lower cover 22 with space for accommodation, and therefore the upper cover 20 and the lower cover 22 can be configured to be coupled to each other to form an interior space for accommodating reticle pod. Moreover, at least a clapboard 24 is disposed in the space for accommodation of the lower cover 22, and at least a fixing element 1 is further disposed on the top surface of inner side of the space for accommodation of upper cover 20. Furthermore, in the space for accommodation of lower cover 22, at least a pair of guide tracks 220 are disposed on two opposite lateral sides of inner surface of the space for accommodation of lower cover 22 for the clapboard 24 to be set in to separate the space for accommodation into a plurality of spaces for accommodation 28.

According to what is described above, the fixing element 1 of the present invention is disposed on the top surface of inner side of the space for accommodation of upper cover 20. The fixing element includes a top portion 10, on each of two sides of top portion 10 being respectively disposed with a pair of wing portions 12 slantwise extending outward. The pair of wing portions 12 bend downward at a proper bent portion 122 for the free ends of the pair of wing portions 12 to form a clipping portion 14 respectively, and the pair of wing portions 12 further branch and slantwise extend toward inner side of free ends of the pair of wing portions 12 at the bent portion 122 of wing portions 12 to form a resisting portion 16, wherein a first distance C1 is maintained between the resisting portion 16 and the top portion 10 to form a buffer space when the top portion 10 is exerted with pressure.

In addition, the present invention further provides several methods for fastening the fixing element 1 on the top surface of inner surface of upper cover 20. For example, the fixing element 1 can be fastened on the carrier 2 with a fastening element (not shown in Figure). Therefore the fixing element 1 can be disposed with a fastening hole 104 on the top surface of top portion 10, and the fastening element can be a screw element. Or the fixing element 1 can be fastened on the carrier 2 by applying adhesive for connection. Or the fixing element 1 can be integrated with the carrier 2. And thus the fixing element 1 can be installed in a simple way and it is easy for a single fixing element to be removed or replaced.

Figure 7:
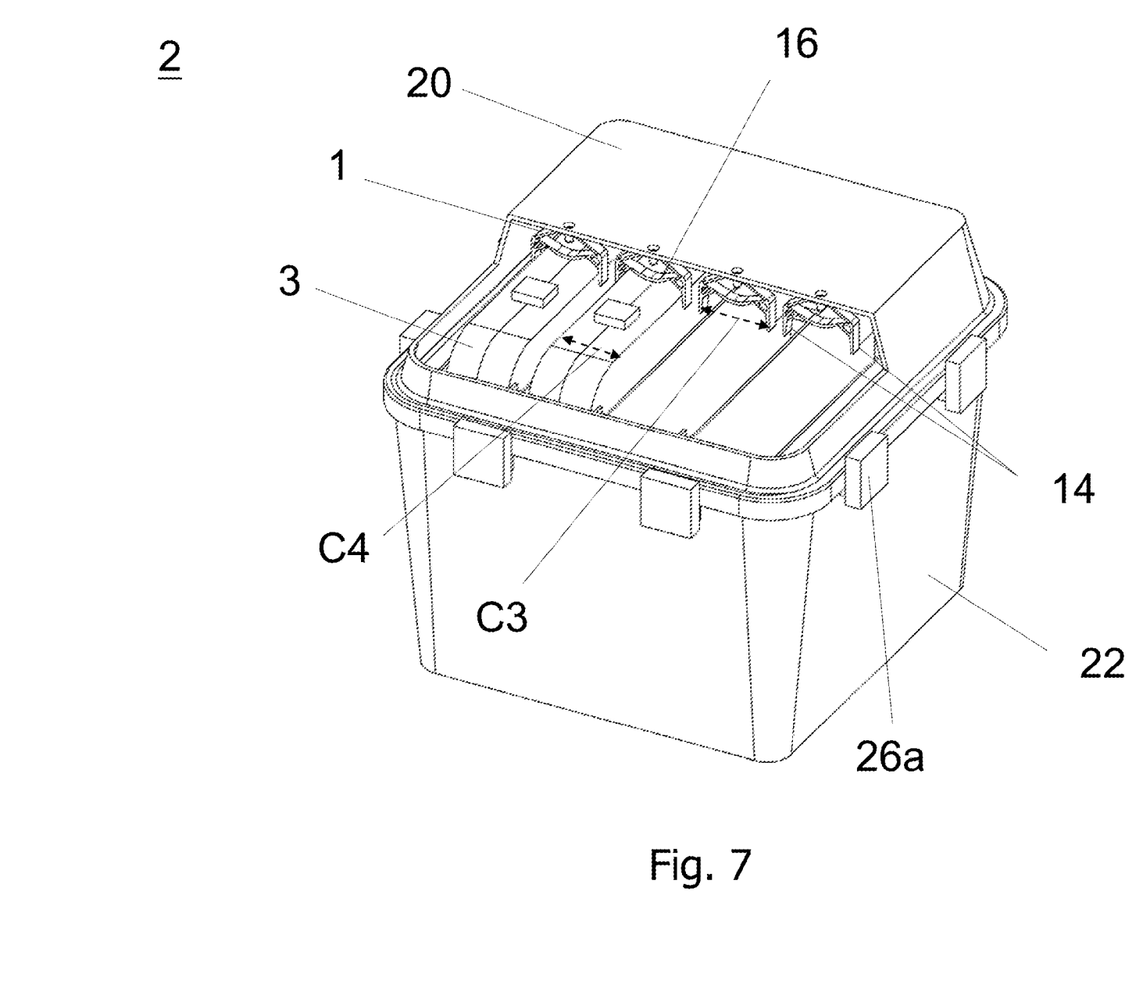
FIG. 7 is a perspective view of carrier of reticle pod of the present invention.

FIG. 7 is a view of a preferred embodiment of carrier for carrying reticle pod according to the present invention. The carrier 2 of reticle pods 3 comprises an upper cover 20 with space for accommodation and a lower cover 22 with space for accommodation, and therefore the upper cover 20 and the lower cover 22 can be configured to be coupled to each other to form an interior space for accommodating reticle pod. Moreover, at least a clapboard 24 is disposed in the space for accommodation of the lower cover 22, and at least a fixing element 1 is further disposed on the top surface of inner side of the space for accommodation of upper cover 20. Furthermore, in the space for accommodation of lower cover 22, at least a pair of guide tracks 220 are disposed on two opposite lateral sides of inner surface of the space for accommodation of lower cover 22 for the clapboard 24 to be set in to separate the space for accommodation into a plurality of spaces for accommodation 28.

When the plurality of reticle pods 3 are sequentially placed in the space for accommodation 28 of carrier 2 and the upper cover 20 closes the lower cover 22, each fixing element 1 of the upper cover 20 can be coupled to each reticle pod 3 stored in the carrier 2. And thus the clipping portion 14 of fixing element 1 can clip the reticle pod 3, and the resisting portion 16 of fixing element 1 can sustain the reticle pod 3 to prevent the photo mask stored in the reticle pod 3 from being affected by rubbing or damaging due to vibration of carrier 2 generated during the process of transferring reticle pod 3, which leads to better effects of vibration-proof and protection and reduction of dust particles generated.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A carrier, including an upper cover with first space for accommodation and a lower cover with second space for accommodation, said upper cover and said lower cover forming a third space for accommodation after closing, at least a pair of guide tracks being disposed on two opposite inner surfaces of space for accommodation of said lower cover for at least a clapboard to be set in to separate said space for accommodation into a plurality of spaces for accommodation, at least a fixing element being further disposed on top surface of inner side of space for accommodation of said upper cover, the characteristic of said fixing element in that:

said fixing element includes a top portion, each of two sides of said top portion being respectively disposed with a pair of wing portions slantwise extending outward, said pair of wing portions bending downward at a proper bent portion for free ends of said pair of wing portions to form clipping portion, and said pair of wing portions further branch and slantwise extending toward inner side of free ends of said pair of wing portions at the bent portion to form a resisting portion, wherein a first distance is maintained between said resisting portion and said top portion.

2. The fixing element according to claim 1, wherein a cylindrical top body is further disposed on said top portion.

3. The fixing element according to claim 2, wherein said cylindrical top body is a hollow top body.

4. The fixing element according to claim 2, wherein a second distance is maintained between said resisting portion and said cylindrical top body.

5. The fixing element according to claim 2, wherein length of said cylindrical top body is ¼~¾ of distance between said top portion and lowest part of said resisting portion.

6. The fixing element according to claim 2, wherein length of said cylindrical top body is half of distance between said top portion and lowest part of said resisting portion.

7. The fixing element according to claim 1, wherein a first included angle formed by said top portion and said wing portions extending slantwise is an obtuse angle.

8. The fixing element according to claim 7, wherein said obtuse angle is 120~160 degrees.

9. The fixing element according to claim 1, wherein a second included angle formed between said wing portions and said resisting portion formed by said wing portions extending slantwise at said bent portion is an acute angle.

10. The fixing element according to claim 9, wherein said acute angle is 20~60 degrees.

11. The fixing element according to claim 1, wherein said resisting portion forms a quasi-V-shaped structure.

12. The fixing element according to claim 11, wherein in whole structure of said resisting portion, thickness of two ends is thinner than that of central part.

13. The fixing element according to claim 1, wherein a first curved groove is formed between each of said bent portion and said free end.

14. The fixing element according to claim 1, wherein said top portion, said wing portions, said bent portion, said clipping portion, and said resisting portion are an integrated structure.

15. The fixing element according to claim 1, wherein material for fabricating said top portion, said wing portions, said bent portion, said clipping portion, and said resisting portion can be selected from the group consisting of: polymer material, plastic material, PE material or PP material.

16. The fixing element according to claim 1, wherein said top portion, said wing portions, said bent portion, said clipping portion, and said resisting portion are made of a flexible material.

17. The fixing element according to claim 1, wherein at least a support portion is further disposed between said clipping portion and said resisting portion.

18. A carrier of reticle pod, including:

an upper cover including a first space for accommodation;

a lower cover including a second space for accommodation, being configured to be coupled to said upper cover to form a third space for accommodation, said lower cover including at least a pair of guide tracks disposed on two opposite lateral sides of inner surface of said lower cover;

at least a clapboard being set into said second space for accommodation of said lower cover via said pair of guide tracks to separate said second space for accommodation into a plurality of fourth spaces for accommodation;

at least a fixing element, disposed on top surface of inner surface of said upper cover, said fixing element includes a top portion, each of two dies of said top portion being respectively disposed with a pair of wing portions slantwise extending outward, said pair of wing portions bending downward at a proper bent portion for free ends of wing portions to form clipping portion respectively, and said pair of wing portions further branch and slantwise extending toward inner side of free ends of said pair of wing portions at the bent portion to form a resisting portion, and a first distance is maintained between said resisting portion and said top portion;

at least a reticle pod, being placed in said fourth space for accommodation;

wherein when said upper cover and said lower cover of said carrier close, said reticle pod is contacted and fixed by said fixing element on said upper cover.

* * * * *